(12) United States Patent
Hossain et al.

(10) Patent No.: US 10,587,276 B2
(45) Date of Patent: *Mar. 10, 2020

(54) WIDE RANGE FREQUENCY SYNTHESIZER WITH QUADRATURE GENERATION AND SPUR CANCELLATION

(71) Applicant: Rambus Inc., Sunnyvale, CA (US)

(72) Inventors: Masum Hossain, Edmonton (CA); Farshid Aryanfar, Allen, TX (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/382,580

(22) Filed: Apr. 12, 2019

(65) Prior Publication Data

US 2019/0253059 A1    Aug. 15, 2019

Related U.S. Application Data

(63) Continuation of application No. 15/605,932, filed on May 25, 2017, now Pat. No. 10,298,244, which is a
(Continued)

(51) Int. Cl.
*H03L 7/06* (2006.01)
*H03L 7/23* (2006.01)
(Continued)

(52) U.S. Cl.
CPC .............. *H03L 7/235* (2013.01); *H03L 7/081* (2013.01); *H03L 7/0805* (2013.01); *H03L 7/099* (2013.01);
(Continued)

(58) Field of Classification Search
CPC ....... H03L 7/235; H03L 7/0805; H03L 7/081; H03L 7/099; H03L 7/0995; H03L 7/18; H03L 7/23
(Continued)

(56) References Cited

U.S. PATENT DOCUMENTS 5,943,382 A * 8/1999 Li .............................. G09G 3/20
                                                                375/375
5,977,806 A   11/1999 Kikuchi
(Continued)

OTHER PUBLICATIONS

Hanumolu et al., "A Sub-Picosecond Resolution 0.5-1.5 GHz Digital-to-Phase Converter," IEEE Journal of Solid-State Circuits, vol. 43, No. 2, pp. 414-424, Feb. 2008. 11 pages.
(Continued)

*Primary Examiner* — Ryan Jager
(74) *Attorney, Agent, or Firm* — Fenwick & West LLP

(57) ABSTRACT

A frequency synthesizer generates a wide range of frequencies from a single oscillator while achieving good noise performance. A cascaded phase-locked loop (PLL) circuit includes a first PLL circuit with an LC voltage controlled oscillator (VCO) and a second PLL circuit with a ring VCO. A feedforward path from the first PLL circuit to the second PLL circuit provides means and signal path for cancellation of phase noise, thereby reducing or eliminating spur and quantization effects. The frequency synthesizer can directly generate in-phase and quadrature phase output signals. A split-tuned ring-based VCO is controlled via a phase error detection loop to reduce or eliminate phase error between the quadrature signals.

19 Claims, 12 Drawing Sheets

Related U.S. Application Data continuation of application No. 14/746,618, filed on Jun. 22, 2015, now Pat. No. 9,692,431, which is a continuation of application No. 13/830,007, filed on Mar. 14, 2013, now Pat. No. 9,094,028.

(60) Provisional application No. 61/622,977, filed on Apr. 11, 2012.

(51) Int. Cl.
*H03L 7/08* (2006.01)
*H03L 7/081* (2006.01)
*H03L 7/099* (2006.01)
*H03L 7/18* (2006.01)

(52) U.S. Cl.
CPC .............. *H03L 7/0995* (2013.01); *H03L 7/18* (2013.01); *H03L 7/23* (2013.01)

(58) Field of Classification Search
USPC .................................................. 327/149–159
See application file for complete search history.

(56) References Cited

U.S. PATENT DOCUMENTS

| | | | |
|---|---|---|---|
| 6,333,678 B1 * | 12/2001 | Brown | H03L 7/18 331/2 |
| 6,703,902 B2 | 3/2004 | Jeon et al. | |
| 6,833,764 B1 | 12/2004 | Dean | |
| 6,842,056 B1 | 1/2005 | Wong et al. | |
| 7,043,202 B2 | 5/2006 | Ozawa et al. | |
| 7,181,180 B1 | 2/2007 | Teo et al. | |
| 7,301,404 B2 | 11/2007 | Mattisson | |
| 7,486,145 B2 | 2/2009 | Floyd et al. | |
| 7,574,185 B2 * | 8/2009 | Ko | H03L 7/1976 455/255 |
| 7,821,343 B1 | 10/2010 | Wong et al. | |
| 8,334,725 B2 * | 12/2012 | Wang | H03K 3/0315 331/1 A |
| 8,416,025 B2 | 4/2013 | Lin et al. | |
| 8,433,018 B2 | 4/2013 | Sidiropoulos et al. | |
| 8,718,217 B2 | 5/2014 | Walker et al. | |
| 9,735,788 B2 | 8/2017 | Lee et al. | |
| 2003/0119466 A1 * | 6/2003 | Goldman | H03L 7/12 455/260 |
| 2004/0164776 A1 * | 8/2004 | Zampetti | H03L 7/07 327/156 |
| 2008/0111633 A1 * | 5/2008 | Cranford | H03L 7/0898 331/10 |
| 2008/0258799 A1 * | 10/2008 | Teraguchi | H03K 17/005 327/427 |
| 2008/0260071 A1 | 10/2008 | Sidiropoulos et al. | |
| 2008/0290953 A1 | 11/2008 | Sandner et al. | |
| 2009/0066423 A1 | 3/2009 | Sareen et al. | |
| 2009/0184773 A1 | 7/2009 | Woo et al. | |
| 2010/0020730 A1 | 1/2010 | Man et al. | |
| 2010/0090723 A1 | 4/2010 | Nedovic et al. | |
| 2010/0090733 A1 | 4/2010 | Kristensson et al. | |
| 2010/0119024 A1 | 5/2010 | Shumarayev et al. | |
| 2010/0259305 A1 | 10/2010 | Lee et al. | |
| 2011/0148484 A1 | 6/2011 | Kim et al. | |
| 2011/0148498 A1 | 6/2011 | Mosalikanti et al. | |
| 2016/0182065 A1 * | 6/2016 | Wicpalek | H03L 7/099 327/156 |

OTHER PUBLICATIONS

Jian et al. "A Fractional-N PLL for Multiband (0.8-6 GHz) Communications Using Binary-Weighted D/A Differentiator and Offset-Frequency Δ-ΣModulator," IEEE Journal of Solid-State Circuits, vol. 45, No. 4, pp. 768,780, Apr. 2010. 13 pages.

Lai, Xiongliang, "Design and Analysis of a Dual-Mode Cascaded-Loop Frequency Synthesizer," Thesis submitted to Brigham Young University, Aug. 2009. 147 pages.

Lin et al., "A Delta-Sigma Modulator With a Phase-to-Digital and Digital-to-Phase Quantizer," 2011 IEEE 9th International New Circuits and Systems Conference (NEWCAS), pp. 209-212, Jun. 26-29, 2011. 4 pages.

Park et al., "A Low-Noise and Low-Power Frequency Synthesizer Using Offset Phase-Locked Loop in 0.13-um CMOS," IEEE Microwave and Wireless Components Letters, vol. 20, No. 1, pp. 52-54, Jan. 2010. 3 pages.

* cited by examiner

WIDE RANGE FREQUENCY SYNTHESIZER WITH QUADRATURE GENERATION AND SPUR CANCELLATION

CROSS REFERENCE TO RELATED APPLICATIONS

This application is a continuation of U.S. application Ser. No. 15/605,932 filed on May 25, 2017, now U.S. Pat. No. 10,298,244, which is a continuation of U.S. application Ser. No. 14/746,618 filed on Jun. 22, 2015, now U.S. Pat. No. 9,692,431, which is a continuation of U.S. application Ser. No. 13/830,007 filed on Mar. 14, 2013, now U.S. Pat. No. 9,094,028, which claims the benefit of U.S. Provisional Application No. 61/622,977 entitled "Wide Range Frequency Synthesizer with Quadrature Generation and Spur Cancellation" to Masum Hossain, et al., filed on Apr. 11, 2012, the contents of which are each incorporated by reference herein.

BACKGROUND

Frequency synthesizers are commonly used in wireless communication systems for generating a range of frequencies from a single oscillator. In recent years, the number of different wireless bands and standards in which a mobile device may communicate has increased dramatically. For example, mobile devices may communicate using different standards such as GSM/EDGE, 3G, 4G, WiFi, GPS, Bluetooth, and others, each of which utilize different frequency bands. However, traditional frequency synthesizers are unable to generate low noise signals over a large range of frequencies. While some mobile devices overcome this problem by utilizing multiple frequency synthesizers tuned to different frequency ranges, this traditional design comes at a substantial area and power penalty.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

A frequency synthesizer generates a wide range of frequencies from a single oscillator while achieving good noise performance. The frequency synthesizer can therefore be used in a multiband wireless transceiver compatible with a variety of different wireless standards. In one embodiment, for example, a frequency range of 900 MHz to 6 GHz is achieved to enable compatibility with standards such as, GSM/GPRS/EDGE, WCDMA, RFID, ZigBee, UWB, 802.11 and 802.16.

In one embodiment, the frequency synthesizer comprises a cascaded phase-locked loop (PLL) circuit in which a first PLL circuit has an LC voltage controlled oscillator (VCO) and a second PLL circuit has a ring VCO. A feedforward path from the first PLL circuit to the second PLL circuit improves phase noise, thereby reducing or eliminating spur and quantization effects. Furthermore, an embodiment of the frequency synthesizer directly generates in-phase and quadrature phase output signals and uses a split-tuned ring-based VCO to reduce or eliminate I-Q phase error. Various embodiments of the frequency synthesizer are described in further detail below.

Cascaded Phase-Locked Loop Circuit

Figure 1:
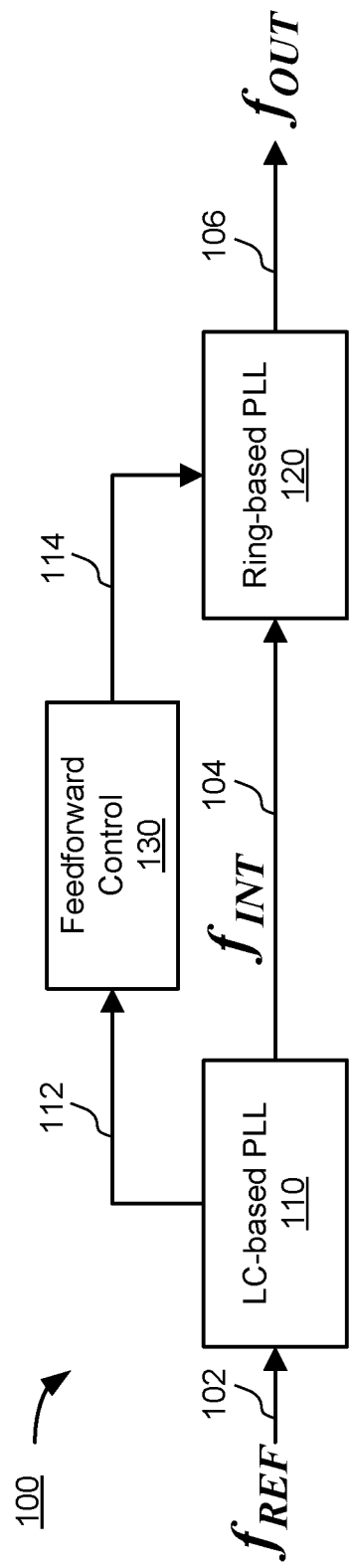
FIG. 1 illustrates a frequency synthesizer having a cascaded PLL architecture according to one embodiment.

FIG. 1 illustrates a high level block diagram of a cascaded phase-locked loop (PLL) architecture 100 for a frequency synthesizer. Cascaded PLL architecture 100 comprises a first PLL circuit 110, a second PLL circuit 120, and a feedforward control circuit 130. First PLL circuit 110 receives a reference signal 102 having a reference frequency $f_{REF}$, and generates a control signal 112 and an intermediate signal 104 having a second frequency $f_{INT}$. Second PLL circuit 120 receives intermediate signal 104 having the second frequency $f_{INT}$ and receives a feedforward signal 114. Second PLL circuit 120 generates an output signal 106 having a frequency $f_{OUT}$ based on feedforward signal 114 and intermediate signal 104. Furthermore, feedforward control circuit 130 receives control signal 112 from first PLL circuit 110 and generates feedforward signal 114. In one embodiment, control signal 112 represents noise generated by first PLL 110 (e.g., due to quantization error). Based on this control signal 112, feedforward control circuit 130 generates feedforward signal 114 that adjusts a parameter of second PLL 120 such that the noise is canceled or reduced in output signal 106.

In one embodiment, first PLL circuit 110 comprises a fractional-N LC-based PLL circuit such as, for example, the PLL circuit 200 of FIG. 2 described in further detail below. Furthermore, in one embodiment, second PLL circuit 120 comprises an integer-N ring-based PLL circuit such as, for example, the PLL circuit 420 of FIG. 4 or the circuits of FIG. 6 or FIG. 7 described in further detail below. Overall, the cascaded PLL circuit 100 in this configuration functions as a fractional-N PLL because fractional control of the first PLL 110 enables fractional frequencies to be achieved at the output 106. This particular configuration is furthermore advantageous for achieving a frequency synthesizer with both a wide frequency range and good phase noise. Generally, LC-based PLLs have relatively limited tuning ranges (e.g., within 10-20% deviation from a base frequency such as a range of 9 GHz to 11 GHz) when used in isolation. Ring-based PLL have significantly wider tuning ranges (e.g., 800 MHz to 6 GHz) but often suffer from poor phase noise when used in isolation. In the cascaded configuration described above, the wide range of tuning frequencies associated with ring-based PLL 120 can be achieved at output signal 106. Furthermore, input 104 to ring-based PLL 120 can be configured to have a bandwidth (e.g., 1 GHz or higher) that is high enough that most of ring PLL's 120 phase noise is filtered out. Furthermore, periodic phase noise of the LC-based PLL 110 due to fractional divider and charge pump mismatch can be canceled or reduced via feedforward control circuit 130 as will be described in further detail below with respect to FIGS. 4-5. As a result, cascaded PLL architecture 100 can achieve both good phase noise and a wide tuning range (e.g., 800 MHz to 6 GHz) for compliance with a large variety of wireless standards.

In an alternative embodiment, a cascaded PLL architecture includes an LC-based PLL 110 coupled to a ring-based PLL 120, but omits the feedforward control path (feedforward control 130 and signals 112, 114) shown in FIG. 1. Omitting the feedforward control path may result in increased phase noise, but the architecture can still beneficially achieve a wide tuning range and good enough noise performance that it may be suitable for some applications. In another embodiment, different types of PLLs may be used as first PLL 110 and second PLL 120 (with or without the feedforward control path). For example, in various embodiments, first PLL 110 and second PLL 120 can each either comprise a fractional-N PLL or an integer-N PLL. Furthermore, first PLL 110 and second PLL 120 can each either comprise an LC-based PLL or a ring-based PLL. In other alternative embodiments, three or more cascaded PLLs may be used with at least one feedforward path between them for noise cancellation.

LC-Based Phase Locked Loop Circuit

Figure 2:
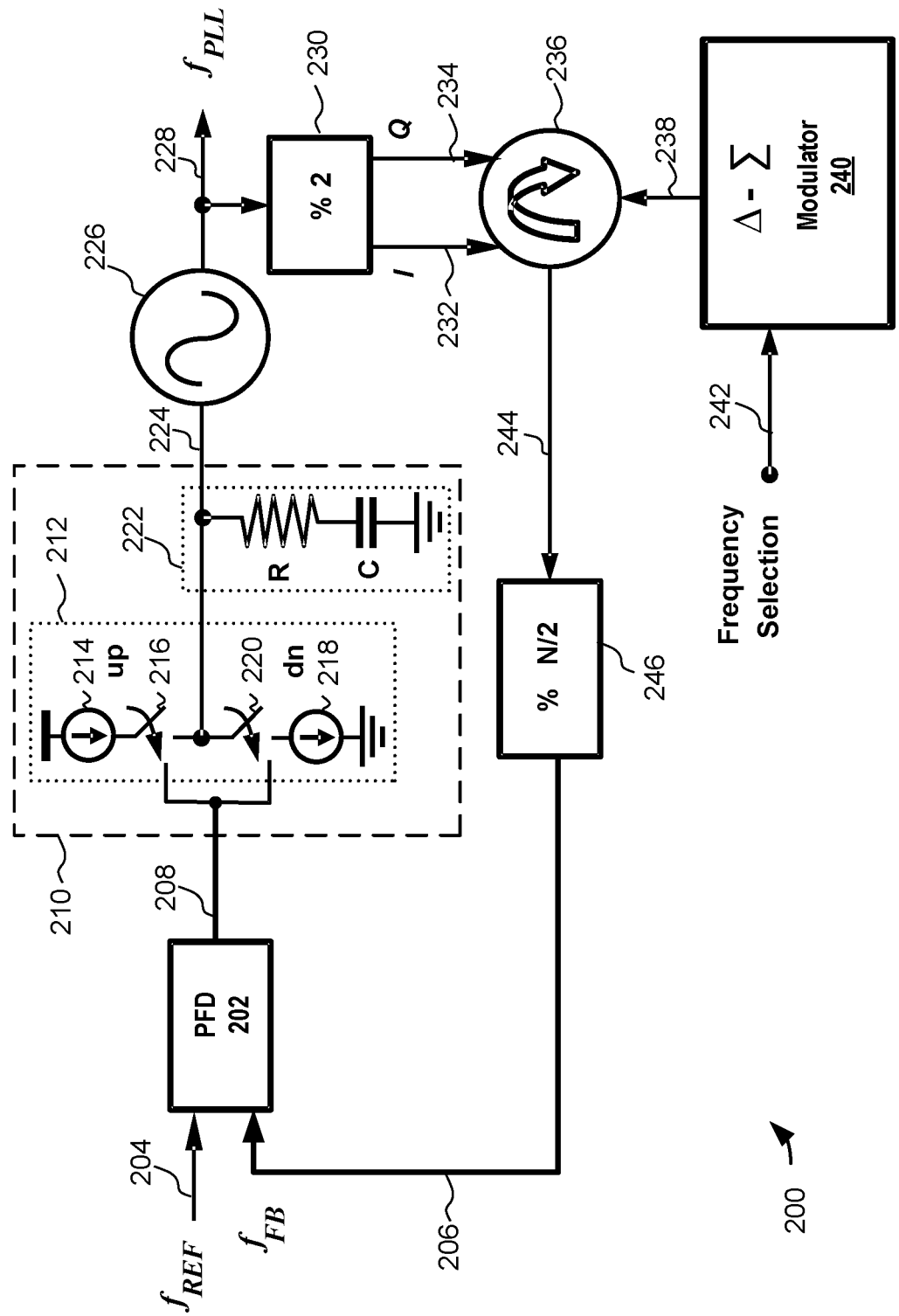
FIG. 2 illustrates a PLL circuit according to one embodiment.

FIG. 2 is a circuit diagram illustrating an LC-based PLL circuit 200 that could be used in the cascaded PLL configuration described above or could be used in a standalone configuration, according to an embodiment. Phase frequency detector (PFD) 202 receives input signal 204 having a reference frequency $f_{REF}$ and PLL feedback signal 206 having a feedback frequency $f_{FB}$. PFD 202 detects the difference in phase and frequency between input signal 204 and feedback signal 206 and generates phase difference signal 208 indicating whether feedback signal 206 lags or leads input signal 204. For example, in one embodiment, phase difference signal 208 comprises an "up signal" (e.g., a logic high signal) if feedback signal 206 leads input signal 204 (indicating that the PLL frequency should be increased) and phase difference signal 208 comprises a "down signal" (e.g., a logic low signal) if feedback signal 206 lags input signal 204 (indicating that the PLL frequency should be decreased).

Control element 210 receives phase difference signal 208 and generates frequency control signal 224 for controlling variable frequency oscillator 226. In one embodiment, control element 210 comprises charge pump 212 and loop filter 222. Charge pump 212 drives current into or draws current from loop filter 222 based on phase difference signal 208. In one embodiment, charge pump 212 is implemented as a first current source 214 coupled to a first switch 216 and a second current source 218 coupled to a second switch 220. When phase difference signal 208 indicates an "up signal," first switch 216 turns on, thereby coupling first current source 214 to loop filter 222, and second switch 220 turns off, thereby decoupling second current source 218 from loop filter 222. This configuration causes a positive current to flow through loop filter 222 and the voltage of frequency control signal 224 increases. Alternatively, when phase difference signal 208 indicates a "down signal," first switch 216 turns off, thereby decoupling first current source 214 from loop filter 222, and second switch 220 turns on, thereby coupling second current source 218 to loop filter 222. This configuration causes a negative current to flow through loop filter 222 and the voltage of frequency control signal 224 decreases. Loop filter 222 filters out jitter and reduces voltage overshoot when charge pump 212 switches between the up configuration and the down configuration. For example, in one embodiment, the loop filter is implemented as a passive RC filter. In alternative embodiments, a different configuration of control element 210 may be used to generate frequency control signal 224 from phase difference signal 208.

Variable frequency oscillator 226 receives the frequency control signal and generates an oscillating output signal 228 having an output frequency $f_{PLL}$ that varies based on frequency control signal 224. Variable frequency oscillator 226 may be implemented as, for example, an LC voltage controlled oscillator (VCO). In general, the frequency $f_{PLL}$ of output signal 228 will have a fractional-N relation with the reference frequency $f_{REF}$, as will be explained in further detail below.

Circuit element 230 generates first phase signal 232 and second phase signal 234 based on output signal 228. First phase signal 232 and second phase signal 234 have the same frequency but second phase signal 234 is phase-shifted relative to first phase signal 232. In one embodiment, circuit element 230 comprises a frequency divider (e.g., a divide frequency by two circuit) and first phase signal 232 and second phase signal 234 comprise in-phase (I) and quadrature phase (Q) component signals respectively each having a frequency of $f_{PLL}/2$. Alternatively, a different phase-shift may be applied and first phase signal 232 and second phase signal 234 are not necessarily 90 degrees out of phase.

Phase interpolator 236 receives first phase signal 232 and second phase signal 234 and generates interpolated signal 244 based on a modulated phase control signal 238. Interpolated signal 244 comprises a signal having an average phase in between (or equal to) the phases of first phase signal 232 and second phase signal 234.

Frequency divider circuit 246 receives interpolated signal 244 and divides the frequency of interpolated signal 244 to generate PLL feedback signal 206. For example in one embodiment, frequency divider circuit 246 divides by N/2, where N is predefined integer value.

In one embodiment, frequency selection signal 242 provides a desired frequency to control output frequency 228 of PLL 200. Modulator 240 (e.g., a delta-sigma modulator) receives frequency selection signal 242 that generates modulated phase control signal 238. In one embodiment, modulated phase control signal 238 is based on a high frequency clock having a frequency much higher than the frequency of first phase signal 232 and second phase signal 234. Modulated phase control signal 238 specifies a selected phase for each period of modulated phase control signal 238 from two or more selectable phases. Modulator 240 selects between the possible phases such that an average phase over time is added by phase interpolator 236 to achieve the desired frequency specified by frequency selection signal 242. For example, in one embodiment, modulator 240 applies a delta-sigma modulation technique to achieve the correct average phase.

In one embodiment, the average phase of modulated signal 244 (relative to the first phase signal 232) is controllable based on a parameter P and a parameter L of phase interpolator 236, where $2^P-1$ specifies a programmable step size out of $2^L$ phase steps evenly spaced between 0° and 360°. For example, if L=4, P=2, there are 16 phase steps (e.g., 0°, 22.5° 45°, 67.5°, 90°, . . . ) and phase interpolator 236 adds, on average, a phase of 3 step sizes (67.5°) to first phase signal 232. Applying a phase shift at each cycle is equivalent to a fractional increase in period, thereby achieving a fractional decrease in frequency of modulated signal 244 relative to first phase signal 232.

The feedback loop of PLL circuit 200 operates to configure the output frequency $f_{PLL}$ so that once divided/reduced in frequency, the feedback frequency $f_{FB}$ will match the reference frequency $f_{REF}$. By varying the parameters, P, L, and N, a variety of different frequencies can be achieved at the output $f_{PLL}$ from a single reference frequency $f_{REF}$.

Operation of PLL circuit 200 can be further understood in view of the equations below. As stated above, the desired output frequency $f_{PLL}$ is achieved when the feedback frequency $f_{FB}$ matches the reference frequency $f_{REF}$, or equivalently, the reference period $T_{REF}$ matches the feedback period $T_{FB}$:

$$T_{REF} = T_{FB} \quad (1)$$

The feedback period $T_{FB}$ is given by:

$$T_{FB} = \left[2T_{PLL} \pm \frac{2T_{PLL}}{2^L}(2^P - 1)\right]\frac{N}{2} \quad (2)$$

where $T_{PLL}$ is the period of output signal 228 (therefore $2T_{PLL}$ is the period of first phase signal 232 and second phase signal 234 generated by element 230), $2^L$ is the number of average phase steps (evenly spaced between 0° and 360°) that phase interpolator 236 can add to the first phase signal 232, $2^P-1$ is the average number of steps applied, and N/2 is the frequency division ratio of frequency divider 246. Thus, as can be seen from equation (2), phase interpolator 236 operates to lengthen or reduce the period $2T_{PLL}$ of first phase signal 234 by some fractional amount. The period is then further lengthened by N/2 to enable a wide range of periods having fraction relationships to the reference period $T_{REF}$. Solving equations (1) and (2) for $T_{REF}$ yields:

$$T_{REF} = \left[1 \pm \frac{2^P - 1}{2^L}\right]NT_{PLL} \quad (3)$$

Converting equation (3) to frequency gives:

$$f_{PLL} = N\left[1 \pm \frac{2^P - 1}{2^L}\right]f_{REF} \quad (4)$$

where $f_{PLL}=1/T_{PLL}$ and $f_{REF}=1/T_{REF}$. As can be seen from equation (4), a desired output frequency $f_{PLL}$ can be achieved from a reference frequency $f_{REF}$ by varying parameters N, P, and L.

Figure 3:
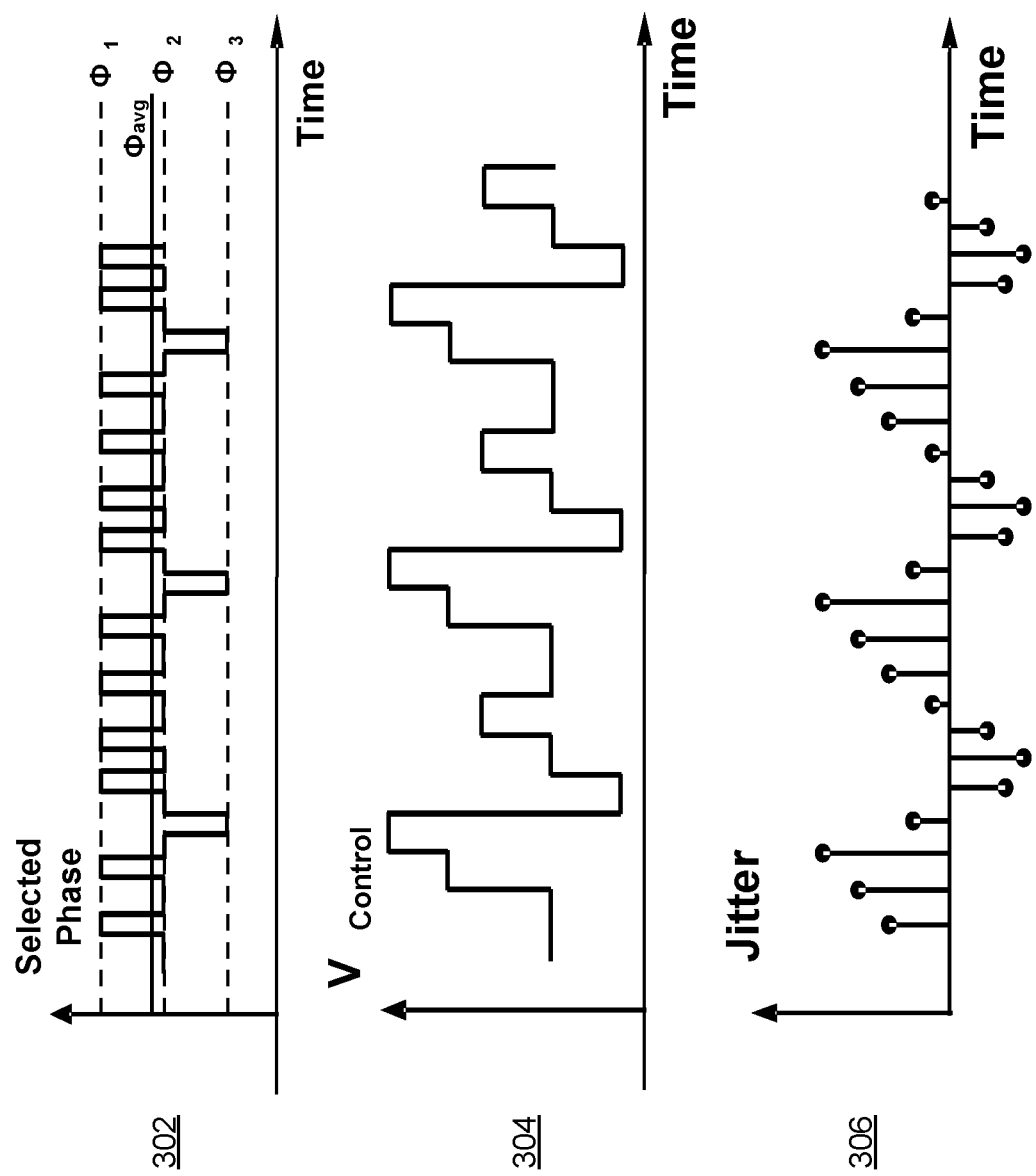
FIG. 3 illustrates waveforms associated with operation of a PLL circuit according to one embodiment.

FIG. 3 illustrates example waveforms showing operation of an example LC-based PLL circuit. Waveform 302 illustrates an example of a modulated signal (e.g., signal 244) produced by a phase interpolator controlled by a modulator. As can be seen, the phase interpolator produces a modulated output signal having an average phase of $\Phi_{avg}$ relative to a reference phase. To achieve this average phase, output of the phase interpolator is time modulated between three possible phases $\Phi_1$, $\Phi_2$, and $\Phi_3$ in accordance with a delta-sigma modulation technique. Waveform 304 illustrates an example of a frequency control signal (e.g., signal 224) applied to an LC-based voltage controlled oscillator. As can be seen, the voltage $V_{Control}$ is stepped up or down over time to provide dithering around an average voltage that will achieve the desired output frequency of the PLL. This dithering results in phase jitter at the output of the PLL as can be seen in waveform 306. The phase jitter represents a deviation in time from ideal zero-crossings of the output signal (e.g., in relation to an ideal clock of the desired output frequency) and results from quantization error of the PLL circuit. This jitter results in typically undesired spur noise in the frequency spectrum of the output signal of the PLL circuit. However, such spur noise can be reduced or canceled in the cascaded PLL configuration as will be explained in further detail below.

Figure 4:
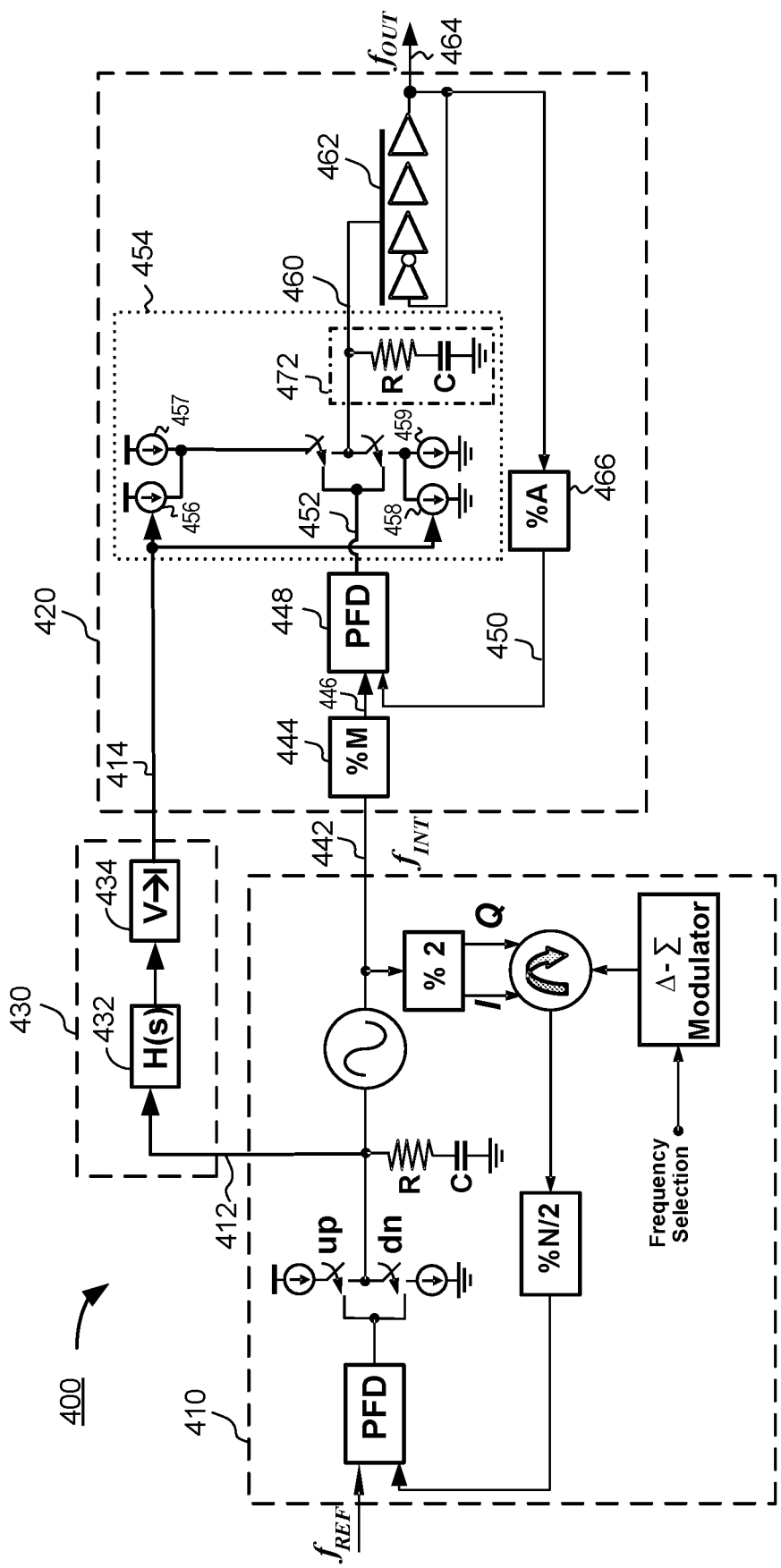
FIG. 4 illustrates a frequency synthesizer circuit having a cascaded PLL architecture according to one embodiment.

FIG. 4 is a more detailed circuit diagram of an embodiment of a cascaded PLL circuit 400 illustrating how spur noise cancellation can be achieved. In this embodiment, first PLL circuit 410 comprises an LC VCO similar or identical in architecture and functionality as PLL circuit 200 of FIG. 2. For example, in one embodiment, first PLL circuit 410 produces an output having a frequency given by $$f_{INT} = N\left[1 \pm \frac{2^P - 1}{2^L}\right]f_{REF}.$$

In second PLL circuit 420, frequency divider 444 receives intermediate signal 442 having a frequency $f_{INT}$ outputted by first PLL circuit 410. In one embodiment, frequency divider 444 divides frequency of intermediate signal 442 by an integer M to produce signal 446 having a frequency $f_{INT}/M$. Phase-frequency detector 448 detects a difference in phase and frequency between signal 446 and feedback signal 450 and produces phase difference signal 452 (which may be, for example, an "up signal" or a "down signal" as described above). Control element 454 operates similarly to control element 210 described above except that secondary current sources 456, 458 are included which are controlled by feedforward signal 414 from feedforward control circuit 430. Note that although secondary current sources 456, 458 are illustrated as current-controlled current sources, these could alternatively be implemented as voltage-controlled current sources by omitting block 434. Thus, some additional current is driven into or drawn from the loop filter 472 based on feedforward control signal 414, operation of which will be described in further detail below. Note that in practice, secondary current sources 456, 458 could be, but are not necessarily separate physical devices from fixed current sources 457, 459.

Control element 454 produces frequency control signal 460 that controls output of ring voltage-controlled oscillator (VCO) 462. The VCO produces output signal 464 having a frequency $f_{OUT}$ which is based on frequency control signal 462. In a feedback loop, frequency divider 466 receives output signal 464 and divides its frequency by an integer A to generate feedback signal 450. Thus, second PLL circuit 420 operates as an integer-N PLL with an output frequency $$f_{OUT} = \frac{A}{M}f_{INT}.$$

The overall transfer function of cascaded PLL circuit 400 is therefore given by $$f_{OUT} = \frac{A}{M} N \left[ 1 \pm \frac{2^P - 1}{2^L} \right] f_{REF}.$$

Therefore, the overall cascaded PLL circuit 400 operates as a fractional-N PLL because the output frequency $f_{OUT}$ can have a fractional relationship with the reference frequency $f_{REF}$.

Feedforward control circuit 430 receives control signal 412 from first PLL circuit 410 and generates feedforward signal 414. In one embodiment, control signal 412 comprises a frequency control signal used to control an LC VCO of first PLL circuit 410. As can be seen in the waveforms of FIG. 3, this signal 412 is representative of the phase jitter that will appear at intermediate output signal 442. In one embodiment, feedforward control circuit 430 comprises a transfer function block 432 and a voltage-to-current block 434. Transfer function block 432 applies a transfer function H(s) to control signal 412 where s is frequency in the Laplace domain. Voltage-to-current block 434 converts the voltage control signal from the transfer function block 432 to generate a current control signal (feedforward signal 414) for controlling current of secondary current sources 456, 458 of control element 454 of second PLL circuit 420. Transfer function block 432 is configured to apply a transfer function H(s) describing the negative relationship between control signal 412 and the resulting jitter appearing at intermediate output signal 442, so that the jitter appearing at output 442 of first PLL circuit 410 is canceled or minimized in second PLL circuit 420.

Figure 5:
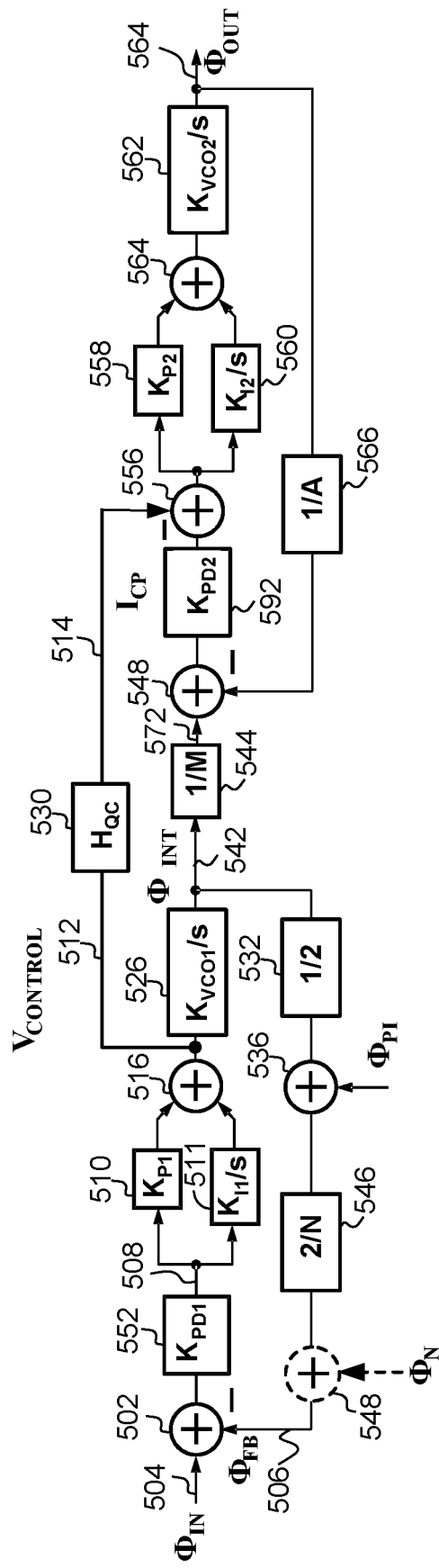
FIG. 5 illustrates a phase-domain linear representation of a cascaded PLL circuit according to one embodiment.

FIG. 5 illustrates a phase-domain linear representation of a cascade PLL circuit (such as the cascaded PLL circuit 400 of FIG. 4) showing operation of a feedforward control path for spur and noise cancellation. Input signal 504 has an input phase $\Phi_{IN}$. Phase adder block 502 computes a difference in phase between the input phase $\Phi_{IN}$ and a feedback phase $\Phi_{FB}$ of a feedback signal 506. Gain block 552 applies a gain $K_{PD1}$ in the phase domain and produces output 508 representing an amplified difference in the phase domain. Blocks 502, 552 collectively apply a transfer function in the phase domain equivalent to that of phase-frequency detector 202 of FIG. 2. Blocks 510 and block 511 apply phase gains of $K_{P1}$ and $K_{I1}/s$ respectively to signal 508 and the outputs from blocks 510, 511 are added by phase adder 516, where s represents frequency in the Laplace domain. Blocks 510, 511, and 516 collectively function as a phase integrator with some gain and model control element 210 in the phase domain to produce control voltage 512. Block 526 applies a phase gain $K_{VCO1}/s$ to produce the intermediate output signal which has an intermediate output phase $\Phi_{INT}$. Block 526 models variable frequency oscillator 226 of FIG. 2. In block 532, a phase gain of ½ is applied which models frequency divider 230 in the phase domain. Phase adder 536 adds a phase $\Phi_{PI}$ and models phase interpolator 236. Block 546 applies a phase gain of 2/N which represents frequency divider 246. Phase adder 548 represents phase noise $\Phi_N$ that is added based on quantization error of the phase interpolator. This phase noise $\Phi_N$ will propagate through the circuit and will result in spur noise unless canceled.

In the linear representation of the second PLL, phase gain block 544 applies a phase gain of 1/M, modeling block 444 of FIG. 4. Phase adder block 548 and phase gain block 592 collectively represent the phase-frequency detector 448. Phase gain blocks 558, 560 and phase adder blocks 556, 564 collectively model element 454. Particularly, phase adder 556 reduces phase based on the feedforward current 514 produced by secondary current sources 456, 458. Gain block 592 applies some additional gain $K_{PD2}$ in the phase domain, to produce an output signal having an output phase $\Phi_{OUT}$ and represents ring VCO 462. Phase gain block 566 represents frequency divider 466.

To cancel propagation of the phase noise $\Phi_N$ to the output phase ($\Phi_{OUT}$, a transfer function $H_{QC}$ is applied to control voltage 512 to generate the feedforward current 514. Absent the cancellation path including block 530, quantization noise $\Phi_N$ would be transferred to the output phase $\Phi_{OUT}$ according to the transfer function:

$$H_{PLL}(s) = \frac{H_{PLL1}(s) H_{PLL2}(s)}{M} \tag{5}$$

where $H_{PLL1}(s)$ is the transfer function of the first PLL from input signal 504 having phase $\Phi_{IN}$ to intermediate output signal 542 having phase $\Phi_{INT}$; and $H_{PLL2}(s)$ is the transfer function of the second PLL (excluding frequency divider block 544) from signal 572 to output signal 564 having a phase $\Phi_{OUT}$. Furthermore, the phase noise $\Phi_N$ will propagate through the cancellation path (represented by block 530) according to the transfer function:

$$H_C(s) = -H_{QC}(s) \frac{H_{PLL2}(s)}{K_{PD2}} \frac{s H_{PLL1}(s)}{K_{VCO1}} \tag{6}$$

Thus, for noise cancellation, the following condition should be met:

$$\frac{H_{PLL1}(s) H_{PLL2}(s)}{M} = H_{QC}(s) \frac{H_{PLL2}(s)}{K_{PD2}} \frac{s H_{PLL1}(s)}{K_{VCO1}} \tag{7}$$

Solving for $H_{QC}$ provides an appropriate transfer function for spur cancellation:

$$H_{QC} = \frac{K_{PD2} K_{VCO}}{M} 1/s \tag{8}$$

Observing that a capacitor with a capacitance C has a Laplace transform of 1/SC, a capacitor can be used to implement block 530 (or block 430 in FIG. 4). The value of the capacitor for spur cancellation is given by:

$$C = \frac{M}{K_{PD2} K_{VCO}} \tag{8}$$

PLL with Split-Tuned Ring VCO

Figure 6A:
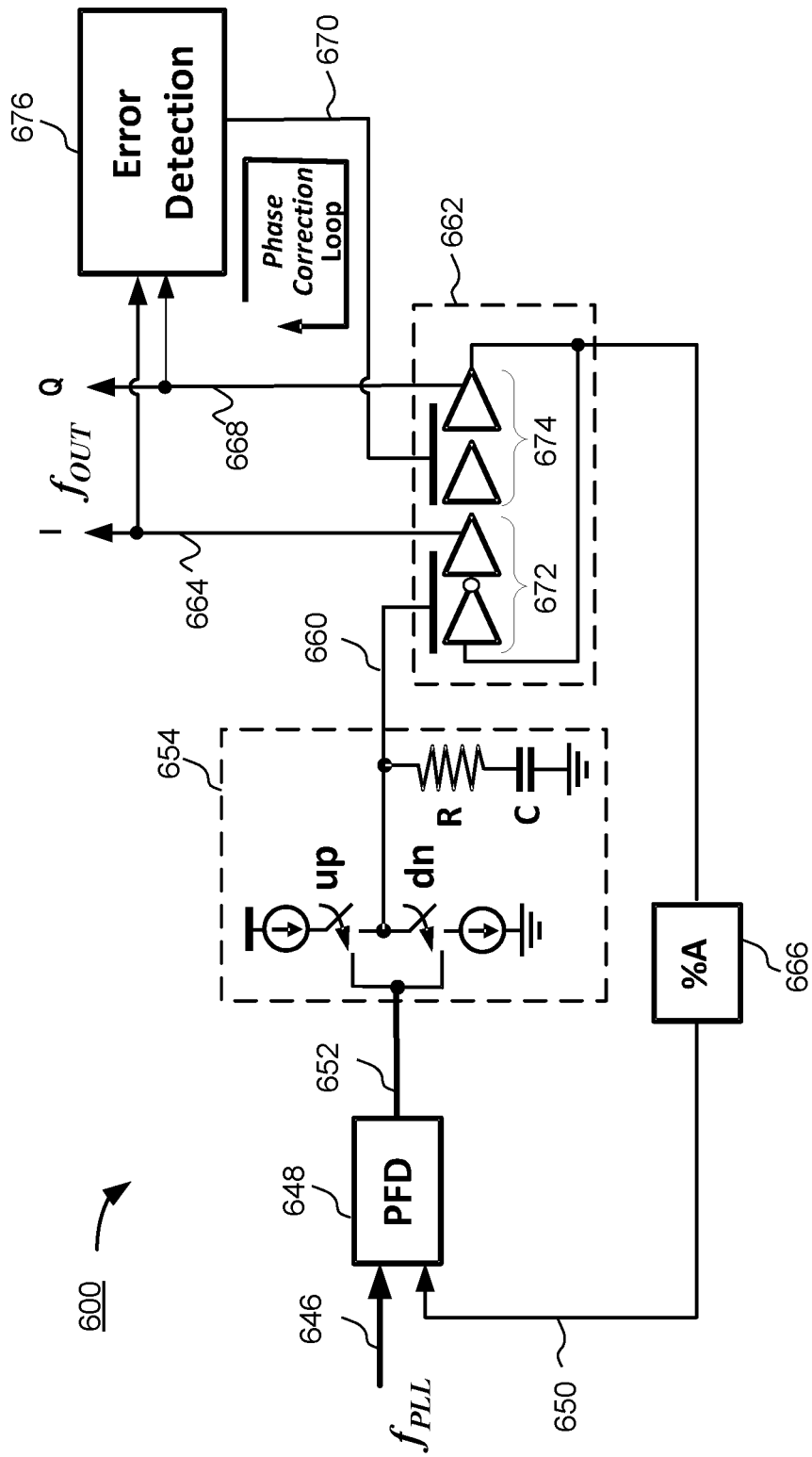
FIG. 6A illustrates a PLL circuit with a split-tuned VCO according to one embodiment.

FIG. 6A illustrates an embodiment of a ring-based PLL 600 with a split tuned ring VCO. PLL 600 is similar in architecture and function to PLL circuit 420 of FIG. 4 but generates two output signals 664, 668 (e.g., I and Q signals) and includes a split-tuned VCO 662 with a phase correction loop. The PLL circuit 600 could be used in a standalone configuration or cascaded with another PLL circuit as described above. For example, the PLL circuit 600 could be used as the second PLL 120 of FIG. 1.

The two output signals 664, 668 comprise signals having the same frequency $f_{OUT}$ but different phases. In one embodiment, for example, the first output signal 664 is an in-phase signal I and the second output signal 668 comprises a quadrature signal Q having a 90° phase shift relative to the first output signal 664. Alternatively, the second output signal 668 could have a different fixed phase relationship to the first output signal 664 that is not necessarily 90°.

PLL circuit 600 comprises a phase-frequency detector 648 that generates phase difference signal 652 based on a difference in phase between input signal 646 and feedback signal 650. Control element 654 generates frequency control signal 660 based on phase difference signal 652. In one embodiment, for example, control element 654 comprises a charge pump and a loop filter as described above. Variable frequency oscillator 662 generates first output signal 664 and second output signal 668 based on frequency control signal 660 and oscillator feedback signal 670. Furthermore, variable frequency oscillator 662 controls the relative phases of first output signal 664 and second output signal 668 based on oscillator feedback signal 670 as will be described in further detail below. Error detection module 676 detects a difference in phase between first output signal 664 and second output signal 668 and compares the detected phase difference to a desired phase difference to determine a phase error. Error detection module 676 then generates oscillator feedback signal 670 indicative of such phase error to reduce the detected phase error. Frequency divider circuit 666 divides the frequency of second output signal 668 (or alternatively, first output signal 664) to generate feedback signal 650.

Ring VCO 662 comprises a chain of circuit elements each with some finite propagation delay such as, for example, a chain of inverters and/or non-inverting buffers. For example, in one embodiment, ring VCO 662 comprises an odd number of inverters. A finite amount of time after a particular logic level is applied to the first input, the last inverter in the chain outputs the inverse logic level. This output is fed back to the input, thus causing an oscillation with a frequency based on the overall delay through ring oscillator 662. The circuit elements of ring oscillator 662 have a controllable delay, thus enabling various oscillation frequencies to be achieved.

In the illustrated embodiment, a first set of circuit elements (e.g., inverters and/or non-inverting buffers) of ring oscillator 662 are grouped together as first delay element 672 with their delays controlled by control signal 660. A second group of circuit elements (e.g., inverters and/or non-inverting buffers) are grouped together as second delay element 674 with their delays controlled by oscillator feedback signal 670. In one embodiment, first delay element 672 and second delay element 674 have different numbers of inverters to ensure an odd number of overall inverters (e.g., first delay element 672 has an odd number of inverters and second delay element 674 has an even number of inverters) in ring oscillator 662. Thus, the overall frequency of VCO 662 is determined by the combined delay through first and second delay elements 672, 674. The phase difference between first output signal 664 and second output signal 668 is determined based on the difference in delays between first delay element 672 and second delay element 674. Thus, a benefit of using a ring oscillator 662 is that multiple output signals 664, 668 having different phases can be drawn from oscillator 662 without requiring an additional phase shifting element separate from the oscillator.

Error detection module 676 detects the phase delay of second output signal 668 relative to first output signal 664. Error detection module 676 then compares the phase delay to a desired phase delay. If the detected phase delay is greater than desired (i.e., second output signal 668 lags too far behind first output signal 664), error detection module 676 adjusts oscillator feedback signal 670 to decrease the delay through second delay element 674. This will momentarily cause an overall increase in frequency of first and second output signals 664, 668. However, the PLL circuit 600 will compensate for the frequency increase by adjusting control signal 660 to cause a corresponding increase in delay of first delay element 672, thereby maintaining the desired output frequency. Similarly, when the detected phase delay is less than desired (i.e., second output signal 668 does not lag far enough behind first output signal 664), error detection module 676 will cause an increase in delay through second delay element 674, and the PLL circuit 600 will cause a corresponding decrease in delay through first delay element 672 to achieve both the desired output frequency and the desired phase difference between first and second output signal 664, 668.

Figure 6B:
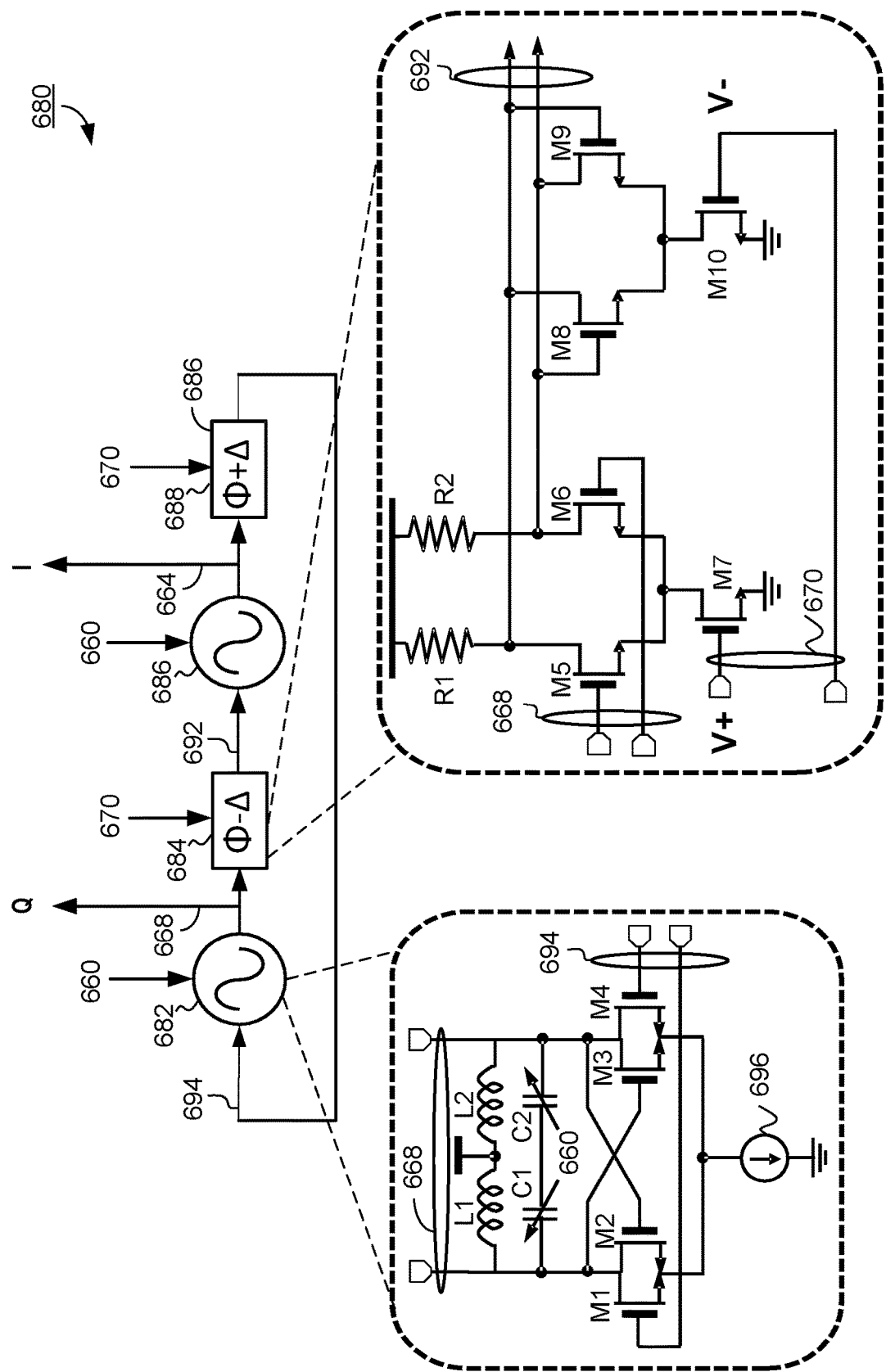
FIG. 6B illustrates a split-tuned LC-based VCO according to one embodiment.

FIG. 6B illustrates an embodiment of a split-tuned LC-based VCO 680 that can be used in the place of the split-tuned ring VCO 662 show in FIG. 6A. The split-tuned LC-based VCO 680 receives frequency control signal 660 and oscillator feedback signal 670, and produce first and second output signals 664, 668. In one embodiment, the split-tuned LC-based VCO comprises a first LC-based VCO 682, a second LC-based VCO 686, a first coupling element 684, and a second coupling element 688. The first LC-based VCO 686 receives a first reference signal 694 having a first reference frequency and generates a first output signal 668 having a first output frequency based on frequency control signal 660. First coupling element 684 receives the first output signal 668 having a phase φ and applies a phase shift by subtracting a phase Δ to generate signal 692, where the phase shift amount Δ is based on oscillator feedback signal 670. Second LC-based VCO 686 receives signal 692 (a second reference signal) and generates a second output signal 664 having a second output frequency based on frequency control signal 660. Second coupling element 688 receives second output signal 664 having a phase φ and applies a phase shift by adding the phase Δ to generate signal 694, where the phase shift amount Δ is based on oscillator feedback signal 670 and is the same as shift amount applied by coupling element 684. Signal 694 outputted by second coupling element 688 is the input to first LC-based VCO 682, thus forming a closed loop system. In one embodiment, first and second output signals 668, 664 are Q and I signals respectively of a quadrature output and are thus 90° out of phase.

An example circuit for use as the first LC-based VCO 682 is illustrated comprising inductors L1, L2, transistors M1, M2, M3, M4, current source 696, and variable capacitors C1, C2 arranged as an LC-based VCO. Frequency control input 660 controls capacitance of variable capacitors C1, C2 in order to achieve variations in frequency of the output signal 668 (which is shown as a differential signal) in relation to the reference signal 694 (which is shown as a differential signal). Second LC-based VCO 686 may have a similar or identical architecture. In alternative embodiments, different variations of LC-based VCOs can be used that operate according to similar principles.

An example circuit for coupling element 684 is also illustrated comprising resistors R1, R2 and transistors M5-M10. The circuit elements are arranged to operate as a phase shifter to shift a phase of an input (e.g., first output signal 668 which is shown as a differential signal) based on an amount Δ proportional to the difference between V+ and V−, to produce an output (e.g., signal 692 which is shown as a differential signal). Coupling element 688 can be implemented according to similar or the same architecture as coupling element 684 except that differential inputs V+ and V− are switched in order to achieve a shift of +Δ instead of −Δ. In alternative embodiments, different variations of coupling elements 684, 688 can be used that operate according to similar principles.

The LC-based VCO 680 achieves a similar function to the ring-based VCO 662 described above. Frequency control signal 660 controls overall oscillation frequency of the LC-based VCO 680. Feedback oscillation signal 670 controls an amount of phase shift between the two output signals 668, 664 in order to achieve the desired phase relationship (e.g., quadrature signals that are 90° out of phase).

Figure 7:
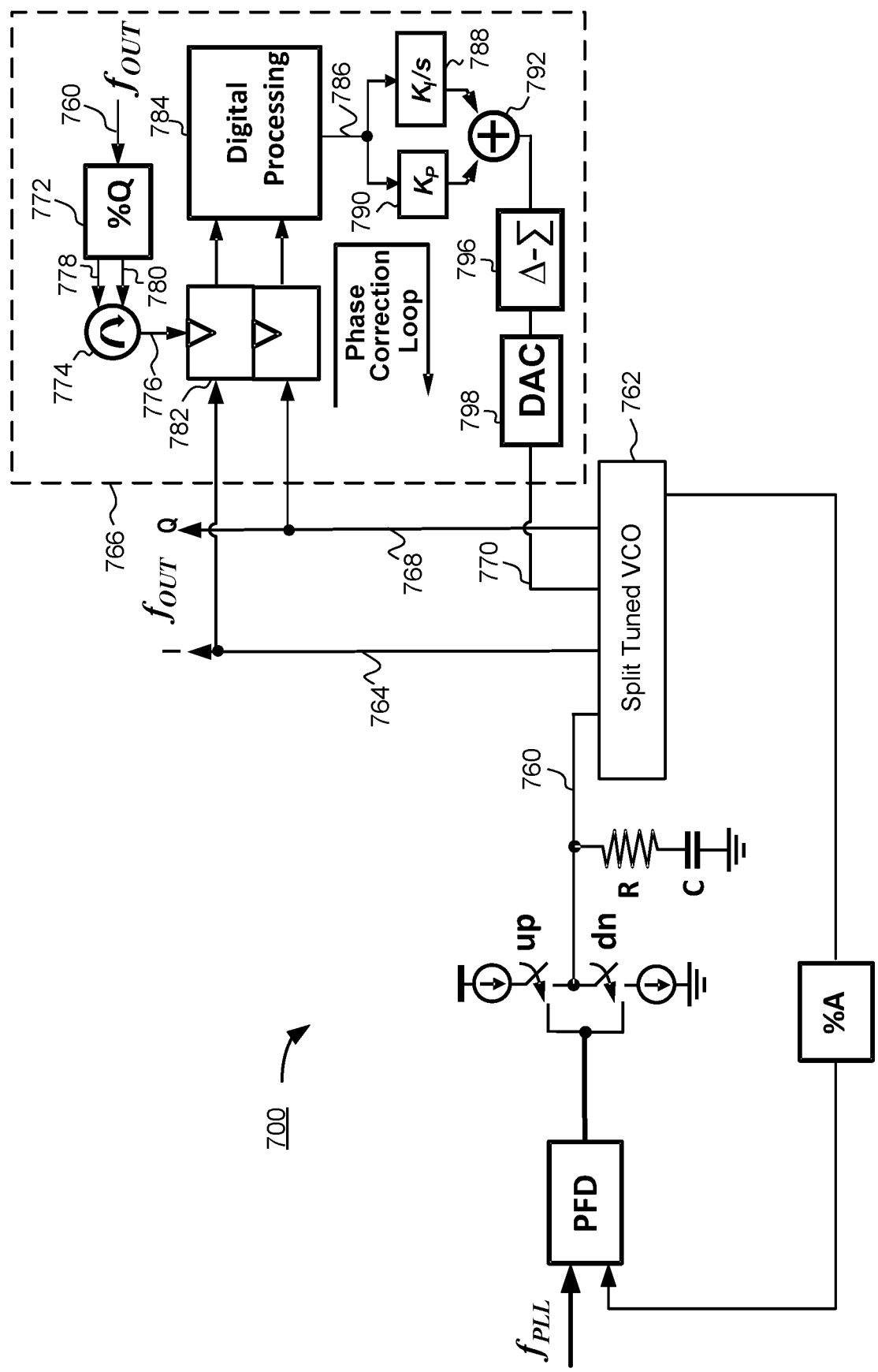
FIG. 7 illustrates a phase error correction module for a PLL circuit according to one embodiment.

FIG. 7 illustrates one example implementation of an error detection module 766 for use in a phase correction loop for a split-tuned VCO 762 which could be, for example, a split-tuned ring-based VCO 662 as described in FIG. 6A or a split-tuned LC-based VCO 680 as described in FIG. 6B. The error detection module 766 could be used as error detection module 676 in FIG. 6A described above. Frequency divider 772 and phase interpolator 774 generate phase rotating clock signal 776 based on input clock signal 760 having a same frequency $f_{OUT}$ as output signals 764, 768. Specifically, frequency divider 772 divides input clock signal 760 into two signals 778, 780 having different phases (e.g., two signals that are 90° out of phase). Phase interpolator 774 then interpolates the two signals 778, 780, where the mixture of signals 778, 780 changes over time. For example, in one embodiment, the amount of phase shift applied to signal 778 increases incrementally over time to achieve a rotating phase of phase rotating clock signal 776. Sampler 782 samples first output signal 764 and second output signal 768 based on rotating phase clock signal 776 and the samples are provided to digital processing module 784. By determining transition timing of the samples (e.g., when the samples transition from low to high or high to low), digital processing module 784 can determine the relative timing of the transitions and therefore determine the phase difference between first input signal 764 and second input signal 768. Digital processing module 784 outputs phase error signal 786 representing the detected difference in phase. Gain blocks 790, 788 and adder 792 collectively implement a digital filter for filtering phase error signal 786. Alternatively, an analog filter or a different type of digital filter implementation could be used. The filtered signal is outputted to modulator 796 (e.g., a delta-sigma modulator) and digital-analog converter 798 to generate oscillator feedback signal 770. Modulation provides quantization noise shaping in the phase correction loop to reduce noise based on limited resolution of the digital phase detection.

In other alternative embodiments, different combinations of the above-described PLL circuits may be used in stand-alone configurations or in cascaded configurations. Furthermore, one or more of the above described PLL circuits can be used in a cascaded configuration with one or more conventional PLL architectures. Beneficially, the described embodiments enable a wide range of frequencies to be synthesized from a single oscillator with high noise performance, thereby enabling compliance with a wide variety of wireless communication standards.

Processes Performed by the PLL Circuits

Figure 8A:
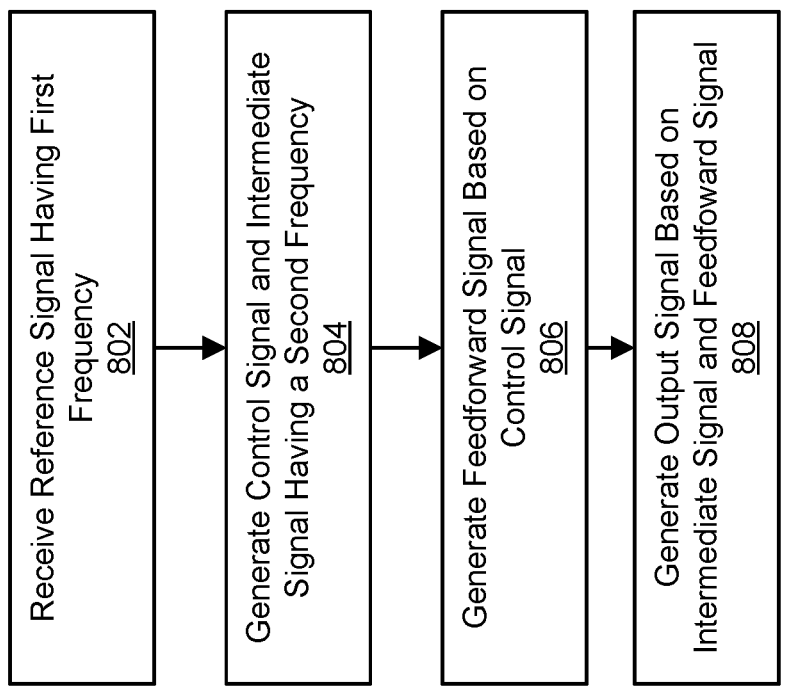
FIG. 8A illustrates a process for frequency synthesis using a cascaded PLL circuit with a feedforward path according to one embodiment.

FIGS. 8A-D illustrate examples of processes that can be performed by the various embodiments of the PLL circuits described above. FIG. 8A illustrates an embodiment of a process performed by a cascaded PLL circuit having an architecture such as that described with respect to FIG. 1 above. In this process, a first phase-locked loop circuit receives 802 a reference signal having a first frequency. The first phase phase-locked loop circuit generates 804 a control signal for a feedforward path and an intermediate signal having a second frequency. A feedforward circuit generates 806 a feedforward signal based on the control signal from the first phase-locked loop. A second phase-locked loop circuit cascaded with the first phase-locked loop circuit generates 808 an output signal signal having a third frequency based on the intermediate signal and the feedforward signal. This feedforward path can beneficially reduce or eliminate propagation of phase noise from the first phase-locked loop circuit to the output signal.

Figure 8B:
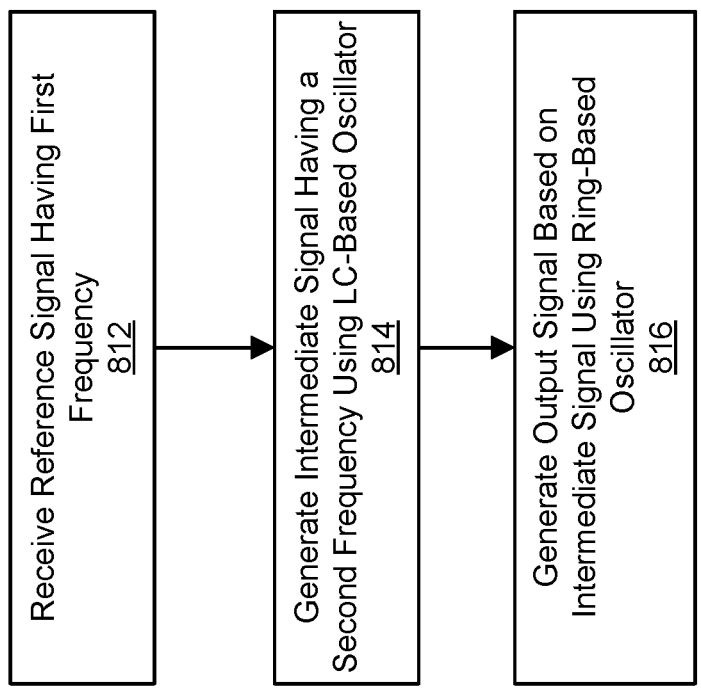
FIG. 8B illustrates a process for frequency synthesis using a cascaded PLL circuit with an LC-based PLL and a ring-based PLL according to one embodiment.

FIG. 8B illustrates another process that can be performed by a cascaded PLL circuit having an architecture such as that described above with respect to FIG. 1. In this process, a first phase-locked loop circuit receives 812 a reference signal having a first frequency. The first phase-locked loop circuit generates 814 an intermediate signal having a second frequency using an LC-based variable frequency oscillator. A second phase-locked loop circuit generates 816 an output signal having a third frequency based on the intermediate signal using a ring-based oscillator.

Figure 8C:
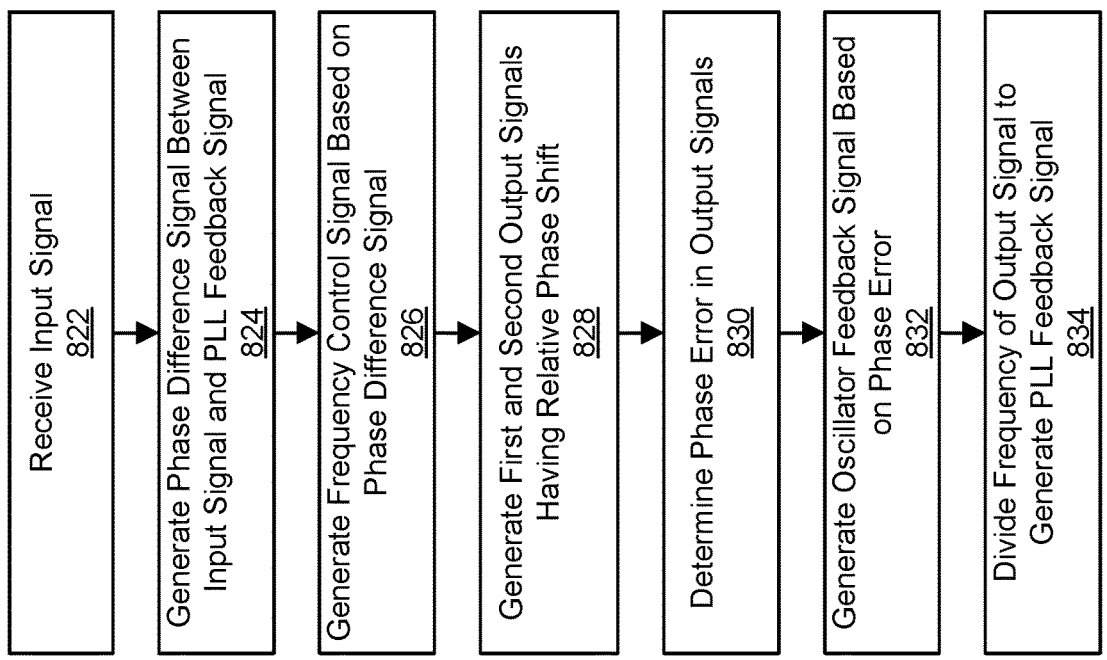
FIG. 8C illustrates a process for frequency synthesis using a PLL circuit producing two output signals having a relative phase shift according to one embodiment.

FIG. 8C illustrates a process that can be performed by a PLL circuit having an architecture such as that described above with respect to FIG. 2. In this process, a phase detector circuit receives 822 an input signal and generates 824 a phase difference signal based on a difference in phase between the input signal and a phase-locked loop feedback signal. A control element generates 826 a frequency control signal based on the phase difference signal. A variable frequency oscillator generates 828 a first output signal and a second output signal in which the second output signal is phase-shifted relative to the first output signal. Here, the frequency of the first and second output signals is controlled based on the frequency control signal and an oscillator feedback signal, and a phase of the second output signal relative to the first output signal is controlled based on the oscillator feedback signal. A phase correction circuit determines 830 a phase error between a detected difference in phases of the first and second output signals and a desired difference in phases of the first and second output signals and generates 832 the oscillator feedback signal to reduce the detected phase error. A frequency divider circuit divides 834 a frequency of the first output signal or the second output signal to generate the phase-locked loop feedback signal.

Figure 8D:
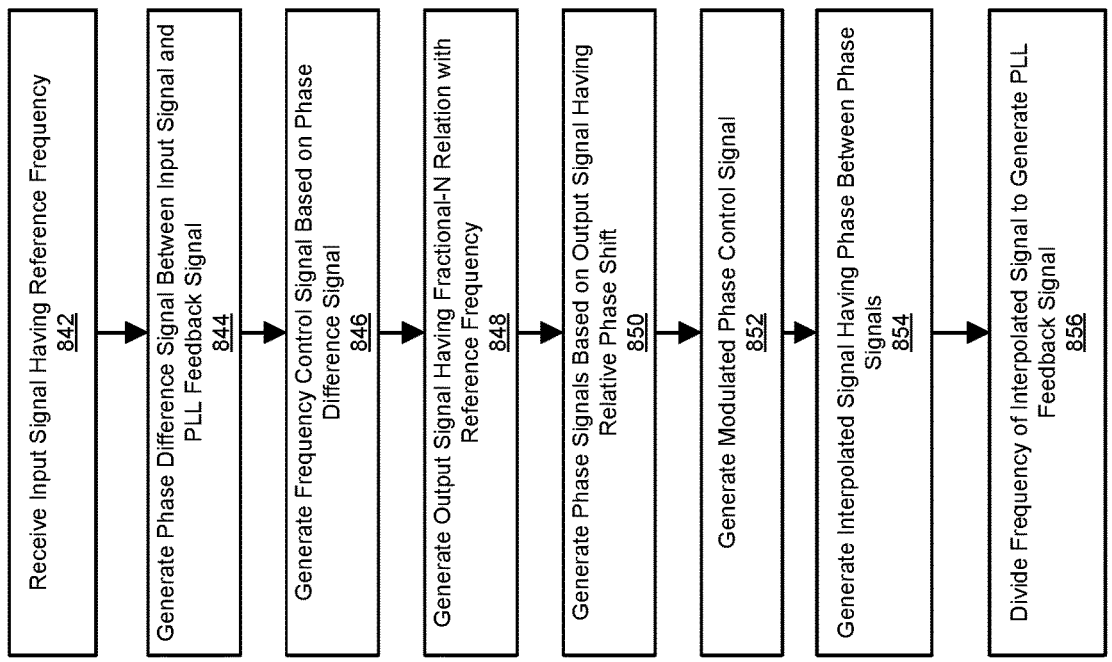
FIG. 8D illustrates a process for frequency synthesis using a PLL having a phase interpolator according to one embodiment.

FIG. 8D illustrates another process that can be performed by a PLL circuit having an architecture such as that described above with respect to FIG. 2. In this process, a phase detector receives 842 an input signal having a reference frequency and generates 844 a phase difference signal based on a difference in phase between an input signal having a reference frequency and a phase-locked loop feedback signal. A control circuit generates 846 a frequency control signal based on the phase difference signal. A variable frequency oscillator generates 848 an output signal having a frequency adjusted based on the frequency control signal and having a fractional-N relation with the reference frequency. A circuit element generates 850 a first phase signal and a second phase signal based on the output signal. Here, both the first and second phase signals have the same frequency as the output signal, and the second phase signal is phase-shifted relative to the first phase signal. A modulator generates 852 a modulated phase control signal specifying a selected phase for each period of the modulated phase control based on a frequency selection signal. A phase interpolator generates 854 an interpolated signal for each period of the modulated phase control signal, the interpolated signal having the selected phase selected from a plurality of selectable phases in between phases of the first phase signal and the second phase signal. A frequency divider circuit then divides 856 a frequency of the interpolated signal to generate the phase-locked loop feedback signal.

In other alternative embodiments, different variations of the example processes described above can be performed by the described frequency synthesizers in order to synthesize signals. For example, in various embodiments, the process steps of FIGS. 8A-8D can be performed in orders other than the orders shown or steps can be performed in parallel. Furthermore, the process steps can be performed by components other than those described.

Upon reading this disclosure, those of ordinary skill in the art will appreciate still alternative structural and functional designs for a frequency synthesizer and processes for frequency synthesis, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A circuit comprising:
   a first phase-locked loop circuit to receive a reference signal having a first frequency and generate an intermediate signal having a second frequency, wherein the first phase-locked loop circuit comprises a fractional-N phase-locked loop circuit;
   a second phase-locked loop circuit to receive the intermediate signal having the second frequency and a feedforward signal to control for jitter in the second phase-locked loop circuit, and generate an output signal having a third frequency based on the intermediate signal and the feedforward signal, wherein the second phase-locked loop circuit comprises an integer-N phase locked loop circuit; and
   a feedforward circuit generate the feedforward signal to control for the jitter in the second phase-locked loop circuit.

2. The circuit of claim 1 wherein the first phase-locked loop comprises:
   a phase detector to generate a phase difference signal based on a difference in phase between the input signal having the first frequency and a phase-locked loop feedback signal;
   a control element to generate the control signal based on the phase difference signal;
   a variable frequency oscillator to generate the intermediate signal having a frequency adjusted based on the control signal;
   a circuit element to generate a first phase signal and a second phase signal based on the intermediate signal, both the first and second phase signals having a same frequency as the intermediate signal, and the second phase signal phase-shifted relative to the first phase signal;
   a modulator to receive a frequency selection signal and generate a modulated phase control signal specifying a selected phase for each period of the modulated phase control signal;
   a phase interpolator to receive the modulated phase control signal and the first and second phase signals, the phase interpolator outputting an interpolated signal for each period of the modulated phase control signal, the interpolated signal having the selected phase selected from a plurality of selectable phases in between phases of the first phase signal and the second phase signal; and
   a frequency divider circuit to divide a frequency of the interpolated signal and generate the phase-locked loop feedback signal.

3. The circuit of claim 1, wherein the second phase-locked loop circuit comprises:
   a forward frequency divider circuit to divide a frequency of the intermediate signal from the first phase-locked loop circuit and generate a frequency-divided input signal;
   a phase detector to generate a phase difference signal based on a difference in phase between the frequency-divided input signal and a phase-locked loop feedback signal;
   a control element to generate a frequency control signal based on the phase difference signal and the feedforward signal;
   a variable frequency oscillator to generate the output signal based on the frequency control signal; and
   a feedback frequency divider circuit to divide a frequency of the output signal and generate the phase-locked loop feedback signal.

4. The circuit of claim 3, wherein the control element comprises:
   a charge pump to provide a current based on the phase difference signal and the feedforward signal; and
   a loop filter to produce the frequency control signal based on the current.

5. The circuit of claim 4, wherein the variable frequency oscillator furthermore generates a quadrature signal having a phase shift relative to the output signal based on an oscillator feedback signal, the second phase-locked loop circuit further comprising:
   an error correction loop to determine a phase error between a detected difference in phases of the output signal and the quadrature signal, to compare the detected difference to a desired difference in phases, and to generate the oscillator feedback signal to reduce the detected phase error.

6. The circuit of claim 1, wherein the third frequency of the output signal is in a range of 900 MHz to 6 GHz.

7. A circuit comprising:
   a first phase-locked loop circuit to receive a reference signal having a first frequency and generate an intermediate signal having a second frequency, wherein the first phase-locked loop circuit comprises an LC voltage controlled oscillator;
   a second phase-locked loop circuit to receive the intermediate signal having the second frequency and a feedforward signal to control for jitter in the second phase-locked loop circuit, and generate an output signal having a third frequency based on the intermediate signal and the feedforward signal, wherein the second phase-locked loop circuit comprises a ring voltage controlled oscillator; and a feedforward circuit generate the feedforward signal to control for the jitter in the second phase-locked loop circuit.

8. The circuit of claim 7, wherein the first phase-locked loop comprises:
   a phase detector to generate a phase difference signal based on a difference in phase between the input signal having the first frequency and a phase-locked loop feedback signal;
   a control element to generate the control signal based on the phase difference signal;
   a variable frequency oscillator to generate the intermediate signal having a frequency adjusted based on the control signal;
   a circuit element to generate a first phase signal and a second phase signal based on the intermediate signal, both the first and second phase signals having a same frequency as the intermediate signal, and the second phase signal phase-shifted relative to the first phase signal;
   a modulator to receive a frequency selection signal and generate a modulated phase control signal specifying a selected phase for each period of the modulated phase control signal;
   a phase interpolator to receive the modulated phase control signal and the first and second phase signals, the phase interpolator outputting an interpolated signal for each period of the modulated phase control signal, the interpolated signal having the selected phase selected from a plurality of selectable phases in between phases of the first phase signal and the second phase signal; and
   a frequency divider circuit to divide a frequency of the interpolated signal and generate the phase-locked loop feedback signal.

9. The circuit of claim 7, wherein the second phase-locked loop circuit comprises:
   a forward frequency divider circuit to divide a frequency of the intermediate signal from the first phase-locked loop circuit and generate a frequency-divided input signal;
   a phase detector to generate a phase difference signal based on a difference in phase between the frequency-divided input signal and a phase-locked loop feedback signal;
   a control element to generate a frequency control signal based on the phase difference signal and the feedforward signal;
   a variable frequency oscillator to generate the output signal based on the frequency control signal; and
   a feedback frequency divider circuit to divide a frequency of the output signal and generate the phase-locked loop feedback signal.

10. The circuit of claim 9, wherein the control element comprises:
    a charge pump to provide a current based on the phase difference signal and the feedforward signal; and
    a loop filter to produce the frequency control signal based on the current.

11. The circuit of claim 10, wherein the variable frequency oscillator furthermore generates a quadrature signal having a phase shift relative to the output signal based on an oscillator feedback signal, the second phase-locked loop circuit further comprising:

an error correction loop to determine a phase error between a detected difference in phases of the output signal and the quadrature signal, to compare the detected difference to a desired difference in phases, and to generate the oscillator feedback signal to reduce the detected phase error.

12. The circuit of claim 7, wherein the third frequency of the output signal is in a range of 900 MHz to 6 GHz.

13. A circuit comprising:
    a first phase-locked loop circuit to receive a reference signal having a first frequency and generate an intermediate signal having a second frequency;
    a second phase-locked loop circuit to receive the intermediate signal having the second frequency and a feedforward signal to control for jitter in the second phase-locked loop circuit, and generate an output signal having a third frequency based on the intermediate signal and the feedforward signal; and
    a feedforward circuit generate the feedforward signal to control for the jitter in the second phase-locked loop circuit, wherein the feedforward circuit has a transfer function based on a phase gain of a voltage controlled oscillator of the first phase-locked loop circuit, a phase gain of a phase detector of the second phase-locked loop circuit, and a forward frequency divider ratio of the second phase-locked loop circuit.

14. The circuit of claim 13, wherein the first phase-locked loop comprises:
    a phase detector to generate a phase difference signal based on a difference in phase between the input signal having the first frequency and a phase-locked loop feedback signal;
    a control element to generate the control signal based on the phase difference signal;
    a variable frequency oscillator to generate the intermediate signal having a frequency adjusted based on the control signal;
    a circuit element to generate a first phase signal and a second phase signal based on the intermediate signal, both the first and second phase signals having a same frequency as the intermediate signal, and the second phase signal phase-shifted relative to the first phase signal;
    a modulator to receive a frequency selection signal and generate a modulated phase control signal specifying a selected phase for each period of the modulated phase control signal;
    a phase interpolator to receive the modulated phase control signal and the first and second phase signals, the phase interpolator outputting an interpolated signal for each period of the modulated phase control signal, the interpolated signal having the selected phase selected from a plurality of selectable phases in between phases of the first phase signal and the second phase signal; and
    a frequency divider circuit to divide a frequency of the interpolated signal and generate the phase-locked loop feedback signal.

15. The circuit of claim 13, wherein the second phase-locked loop circuit comprises:
    a forward frequency divider circuit to divide a frequency of the intermediate signal from the first phase-locked loop circuit and generate a frequency-divided input signal;

a phase detector to generate a phase difference signal based on a difference in phase between the frequency-divided input signal and a phase-locked loop feedback signal;

a control element to generate a frequency control signal based on the phase difference signal and the feedforward signal;

a variable frequency oscillator to generate the output signal based on the frequency control signal; and a feedback frequency divider circuit to divide a frequency of the output signal and generate the phase-locked loop feedback signal.

16. The circuit of claim 13, wherein the third frequency of the output signal is in a range of 900 MHz to 6 GHz.

17. A circuit comprising:
a first phase-locked loop circuit to receive a reference signal having a first frequency and generate an intermediate signal having a second frequency;

a second phase-locked loop circuit to receive the intermediate signal having the second frequency and a feedforward signal to control for jitter in the second phase-locked loop circuit, and generate an output signal having a third frequency based on the intermediate signal and the feedforward signal; and a feedforward circuit generate the feedforward signal to control for the jitter in the second phase-locked loop circuit, wherein the feedforward circuit has a transfer function based on a negative relationship between a voltage applied to a voltage controlled oscillator of the first phase-locked loop circuit and jitter of the intermediate output signal.

18. The circuit of claim 17, wherein the first phase-locked loop comprises:
a phase detector to generate a phase difference signal based on a difference in phase between the input signal having the first frequency and a phase-locked loop feedback signal;

a control element to generate the control signal based on the phase difference signal;

a variable frequency oscillator to generate the intermediate signal having a frequency adjusted based on the control signal;

a circuit element to generate a first phase signal and a second phase signal based on the intermediate signal, both the first and second phase signals having a same frequency as the intermediate signal, and the second phase signal phase-shifted relative to the first phase signal;

a modulator to receive a frequency selection signal and generate a modulated phase control signal specifying a selected phase for each period of the modulated phase control signal;

a phase interpolator to receive the modulated phase control signal and the first and second phase signals, the phase interpolator outputting an interpolated signal for each period of the modulated phase control signal, the interpolated signal having the selected phase selected from a plurality of selectable phases in between phases of the first phase signal and the second phase signal; and a frequency divider circuit to divide a frequency of the interpolated signal and generate the phase-locked loop feedback signal.

19. The circuit of claim 17, wherein the second phase-locked loop circuit comprises:
a forward frequency divider circuit to divide a frequency of the intermediate signal from the first phase-locked loop circuit and generate a frequency-divided input signal;

a phase detector to generate a phase difference signal based on a difference in phase between the frequency-divided input signal and a phase-locked loop feedback signal;

a control element to generate a frequency control signal based on the phase difference signal and the feedforward signal;

a variable frequency oscillator to generate the output signal based on the frequency control signal; and a feedback frequency divider circuit to divide a frequency of the output signal and generate the phase-locked loop feedback signal.

* * * * *